United States Patent
Nakamura et al.

(10) Patent No.: US 9,722,060 B2
(45) Date of Patent: Aug. 1, 2017

(54) SEMICONDUCTOR DEVICE AND SEMICONDUCTOR MODULE

(71) Applicant: Mitsubishi Electric Corporation, Tokyo (JP)

(72) Inventors: Hiroyuki Nakamura, Fukuoka (JP); Akira Okada, Tokyo (JP); Eiji Nojiri, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 1 day.

(21) Appl. No.: 14/926,475

(22) Filed: Oct. 29, 2015

(65) Prior Publication Data

US 2016/0240637 A1 Aug. 18, 2016

(30) Foreign Application Priority Data

Feb. 17, 2015 (JP) ................................ 2015-028540

(51) Int. Cl.
*H01L 29/73* (2006.01)
*H01L 29/739* (2006.01)
*H01L 29/423* (2006.01)
*H01L 23/544* (2006.01)
*H01L 21/66* (2006.01)

(52) U.S. Cl.
CPC .......... *H01L 29/7395* (2013.01); *H01L 22/32* (2013.01); *H01L 23/544* (2013.01); *H01L 29/4232* (2013.01); *H01L 2223/54426* (2013.01); *H01L 2223/54453* (2013.01)

(58) Field of Classification Search
CPC .......................... H01L 29/7395; H01L 23/544
See application file for complete search history.

(56) References Cited

U.S. PATENT DOCUMENTS

| | | | | |
|---|---|---|---|---|
| 2006/0065969 | A1* | 3/2006 | Antol | .................. H01L 23/3171 257/700 |
| 2007/0075414 | A1* | 4/2007 | Tsutsumi | .......... H01L 23/49838 257/692 |
| 2010/0252904 | A1* | 10/2010 | Takahashi | ............. H01L 29/063 257/492 |
| 2014/0299962 | A1 | 10/2014 | Takahashi | |

FOREIGN PATENT DOCUMENTS

JP 2014-204038 A 10/2014

* cited by examiner

*Primary Examiner* — Fernando L Toledo
*Assistant Examiner* — Valerie N Newton
(74) *Attorney, Agent, or Firm* — Studebaker & Brackett PC

(57) ABSTRACT

In a semiconductor device, an element forming region formed with a semiconductor element for controlling a current is defined on a surface of a semiconductor substrate. A termination region is defined so as to surround the element forming region. In a gate electrode, a probe-contacting region and a wire region are defined. The probe-contacting region and the wire region are separated by an insulator formed on a surface of the gate electrode. Thus, the surface of the probe-contacting region and the surface of the wire region are located at the same height.

11 Claims, 7 Drawing Sheets

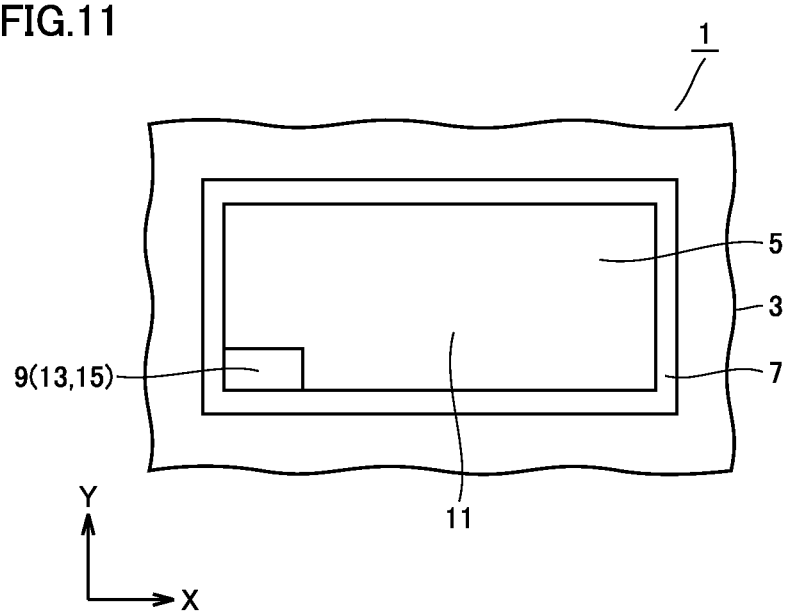
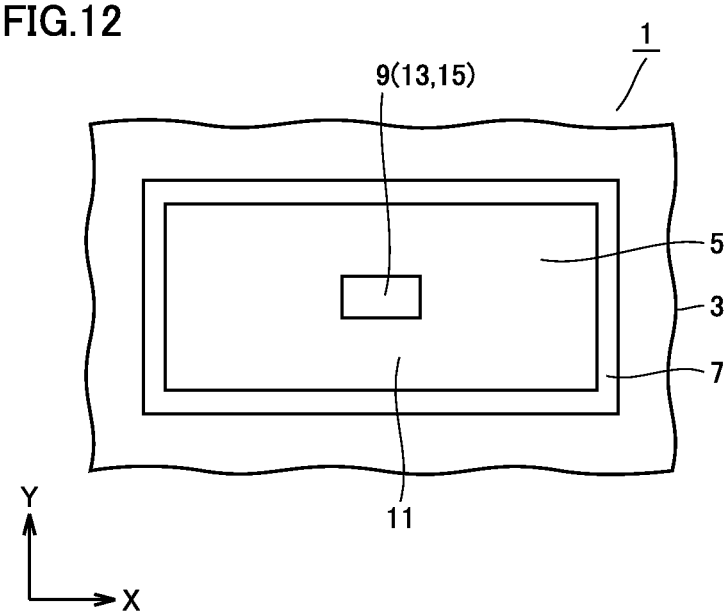

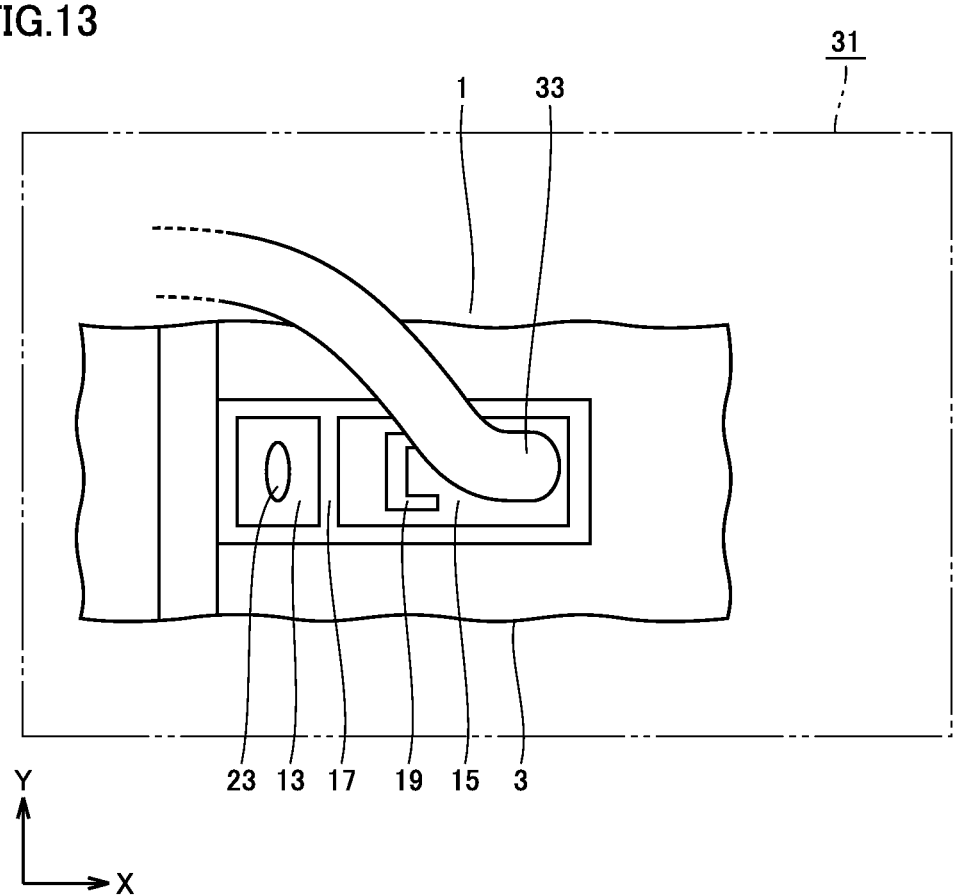

SEMICONDUCTOR DEVICE AND SEMICONDUCTOR MODULE

BACKGROUND OF THE INVENTION

Field of the Invention

The present invention relates to a semiconductor device and a semiconductor module, and in particular, relates to a semiconductor device provided with a high withstand voltage semiconductor element and a semiconductor module provided with the semiconductor device.

Description of the Background Art

In evaluating the electrical characteristics of a semiconductor device (testing subject) mounted in a semiconductor wafer or a semiconductor chip, firstly, the semiconductor device is placed on the surface of a chuck stage of a semiconductor evaluation device. Next, the semiconductor device is fixed on the chuck stage through vacuum suction or the like. Thereafter, a contact probe is made into contact with a predetermined surface electrode of the semiconductor device, and the electrical characteristics are evaluated according to electrical inputs and outputs.

In evaluating the electrical characteristics of a vertical semiconductor device to which a large current is applied in a vertical direction (thickness direction) of the semiconductor device, the surface of the chuck stage is used as the surface electrode. Moreover, in order to apply a large current or a high voltage to the semiconductor device, the contact probe is deployed with a number of pins.

In evaluating the electrical characteristics, it is increasingly demanded that a large current or a high voltage is applied to a semiconductor device, and meanwhile in manufacturing a semiconductor device, it is required to have a lower manufacturing cost, thus, developments have been carried out to miniaturize or reduce each individual semiconductor chip in size so as to increase the number of semiconductor chips that can be disposed on one semiconductor wafer.

In order to miniaturize semiconductor chip while preventing an element forming region (active region) where a power semiconductor element is disposed from being narrowed, an effective approach is to narrow a termination region which surrounds the element forming region. As an example, Japanese Patent Laying-Open No. 2014-204038 discloses a semiconductor device in which the termination region is reduced in footprint.

SUMMARY OF THE INVENTION

Along with the miniaturization of the semiconductor device, for example, a gate electrode or an emitter electrode formed as the surface electrode is also reduced in size. In particular, the footprint of the gate electrode, regardless of the miniaturization of the semiconductor device, may be reduced when the element forming region (active region) is enlarged. In assembling the semiconductor device as a semiconductor module, the gate electrode or the like is connected to a wire, and thus, reducing the footprint of the gate electrode or the like may cause problems in connecting it to a wire. The reason will be explained hereinafter.

As described in the above, in evaluating the electrical characteristics of a semiconductor device, a contact probe is made into contact with the surface of an electrode such as a gate electrode. The tip end of the contact probe is formed into a sharp needle in shape. Thus, as the tip end of the contact probe contacts the surface of the electrode, it may damage the surface of the electrode, roughening the surface of the electrode or causing irregularities to be formed on the surface of the electrode in correspondence to the contact points of the tip end of the contact probe.

In the case where the surface of the electrode to which a wire is connected is made rough or is caused to have irregularities thereon, the adhesion between the wire and the electrode is reduced. As a result, even a semiconductor device is evaluated as non-defective in the electrical characteristics, after it is assembled as a semiconductor module, the wire may disconnect from the electrode, making power supply impossible.

The present invention has been made in view of the above problems, and one object thereof is to provide a semiconductor device ensuring a liable connection of a wire to an electrode and another object thereof is to provide a semiconductor module provided with the semiconductor device.

The semiconductor device according to the present invention includes a semiconductor substrate, an element forming region, a termination region, and a first main surface electrode. The semiconductor substrate has a first main surface and a second main surface facing each other. The element forming region is defined on the first main surface of the semiconductor substrate. The termination region is defined on the first main surface of the semiconductor substrate and is configured to surround the element forming region. The first main surface electrode includes a first electrode formed in the element forming region and provided with a first region and a second region. The first region and the second region are separated by a separation member formed on the surface of the first electrode. The first region is formed into a rectangular shape having a long side and a short side. The second region is located closer to the long side of the first region.

The semiconductor module according to the present invention is such a semiconductor module that is provided with the semiconductor device described in the above, and in such semiconductor module, a wire is connected to the second region of the first electrode.

According to the semiconductor device of the present invention, since the first main surface electrode includes the first electrode which is provided with a first region to be contacted by a contact probe and a second region to be connected by a wire, it is possible to connect the wire to the first electrode reliably.

According to the semiconductor module according to the present invention, it is possible to prevent the wire from getting disconnected from the second region, and thereby preventing power supply to the semiconductor module from being interrupted.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a planar view partially illustrating a semiconductor device according to a first modification;

FIG. 12 is a planar view partially illustrating a semiconductor device according to a second modification; and FIG. 13 is a planar view schematically illustrating a semiconductor module provided with the semiconductor device.

DESCRIPTION OF THE PREFERRED EMBODIMENTS (Semiconductor Device)

Figure 1:
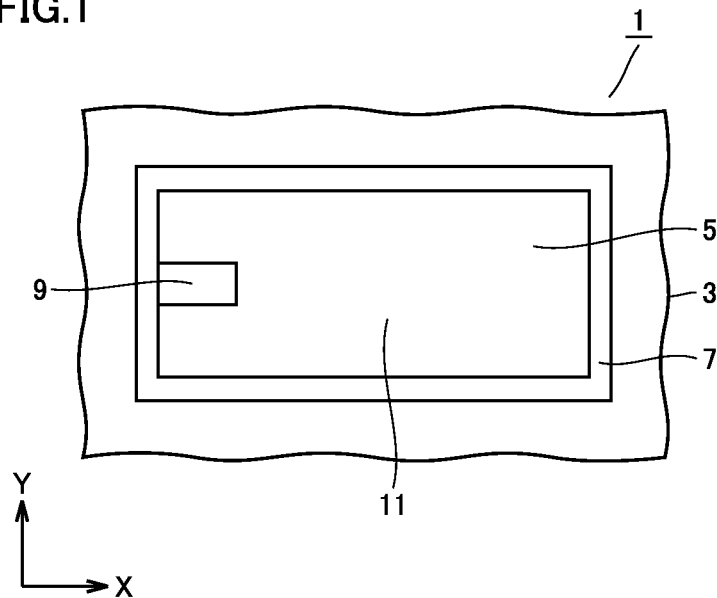
FIG. 1 is a planar view partially illustrating a semiconductor device according to an embodiment of the present invention.

First, a semiconductor device according to an embodiment of the present invention will be described. Particularly, the semiconductor device refers to such a device that is used in a power converter or the like and provided with a high withstand voltage semiconductor element. As illustrated in FIG. 1, in semiconductor device 1, an element forming region 5 (active region), which is formed with semiconductor elements and is configured to control electrical current, is defined on the front surface (first main surface) of semiconductor substrate 3, and a termination region 7 is defined on the same surface, surrounding element forming region 5. Termination region 7 is provided for offering voltage withstand, and may be configured into a guard-ring structure, a RESURF structure or a VLD (Variation of Lateral Doping) structure, for example.

In the present embodiment, an IGBT (Insulated Gate Bipolar Transistor) is given as an example of a high withstand voltage semiconductor element formed in the element forming region. In element forming region 5, a gate electrode 9 and an emitter electrode 11 are disposed. Gate electrode 9 is disposed near termination region 7, adjoining termination region 7. In the case where the high withstand voltage semiconductor element is an IGBT, the back surface (second main surface) of semiconductor substrate 3 is formed with a collector electrode 25 (see FIG. 3).

Figure 2:
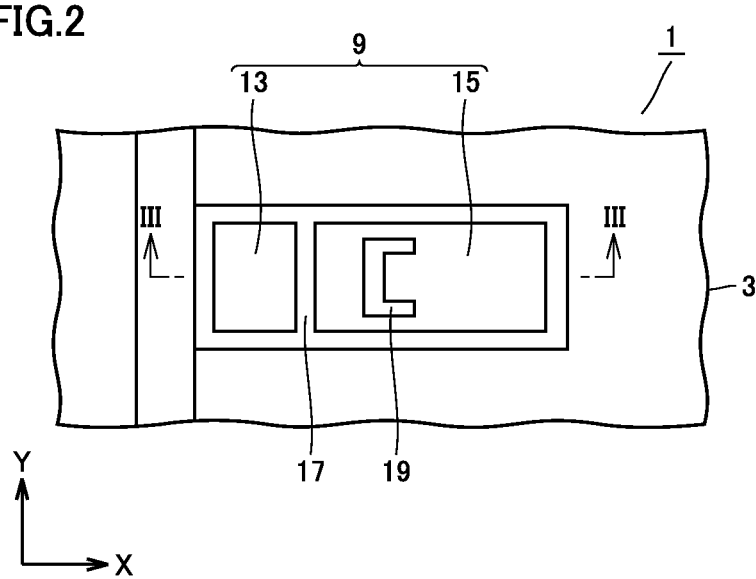
FIG. 2 is a enlarged planar view partially illustrating a gate electrode in FIG. 1 and a surrounding part thereof according to an embodiment of the present invention.
Figure 3:
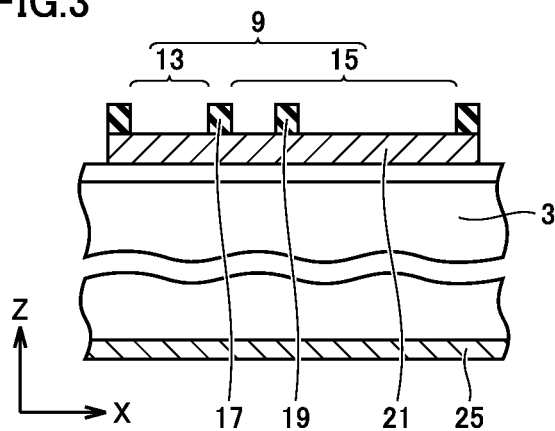
FIG. 3 is a enlarged cross-sectional view partially illustrating a part taken along a section line III-III illustrated in FIG. 2 according to an embodiment of the present invention.

As illustrated in FIGS. 2 and 3, gate electrode 9 is provided with a probe-contacting region 13 and a wiring region 15. Probe-contacting region 13 and wiring region 15 are separated by an insulator 17 formed on the surface of gate electrode 9. The surface of probe-contacting region 13 and the surface of wiring region 15 are located at the same height.

As to be described below, probe-contacting region 13 is configured to be contacted by a contact probe, and wiring region 15 is configured to be connected by a wire. A reference mark 19 is formed in wiring region 15 as a mark for connecting the wire.

The planar shape of probe-contacting region 13 is an oblong (a rectangle) with a long side and a short side. Wiring region 15 is disposed closer to the long side of the rectangular shaped probe-contacting region 13. The area of wiring region 15 is set larger than the area of probe-contacting region 13 for the purpose of providing a longer stable electrical connection between the semiconductor device (gate electrode) and the wire after the semiconductor device is assembled into a product such as a semiconductor module.

In making a contact probe contact probe-contacting region 13, the tip end of the contact probe may slide on the surface of the probe-contacting region, and thus, the rectangular probe-contacting region 13 is arranged in such a manner that the longitudinal direction conforms with the direction along which the tip end of the contact probe slides. This serves as one of the reasons why probe-contacting region 13 is formed into a rectangular shape, and for another reason, it is intended to reduce the area of the gate electrode itself. If the area of the gate electrode is reduced, the element forming region formed with IGBT or the like can be enlarged accordingly. In evaluating the electrical characteristics of semiconductor device 1, the contact probe may be brought into contact with probe-contacting region 13 with reference to insulator 17.

Insulator 17 that separates probe-contacting region 13 and wiring region 15, and reference mark 19 that is formed in wiring region 15 are formed simultaneously through patterning an insulating film which is formed for the purpose of covering probe-contacting region 13, wiring region 15 and the like, and thus, insulator 17 and reference mark 19 have the same height.

Note that in semiconductor device 1, insulator 17 is not limited to separating probe-contacting region 13 and wiring region 15, it may be formed around gate electrode 9 so as to separate gate electrode 9 from the other regions. An electrode member 21 for constituting gate electrode 9 is illustrated in FIG. 3. Electrode member 21 may be formed from aluminum (Al) for example but not limited thereto, any material superior in conductivity and suitable for manufacturing a semiconductor may be selected.

As a material for insulator 17, a semi-insulating silicon nitride film (SInSiN film) may be given as an example but not limited thereto. In the case where the semi-insulating silicon nitride film is formed to cover termination region 7, it is possible to stabilize the potential distribution in termination region 7.

In addition, semiconductor device 1 in the above is described as an example of a vertical semiconductor device in which the electrical current flows between the front surface and the back surface of semiconductor substrate 3 but not limited thereto, semiconductor device 1 may be a lateral semiconductor device in which inputs and outputs are performed on one surface of the semiconductor substrate.

(Evaluation of Electrical Characteristics for Semiconductor Device)

Hereinafter, the evaluation of the electrical characteristics for the semiconductor device mentioned above will be described. Firstly, the structure of the semiconductor evaluation device will be described.

Figure 4:
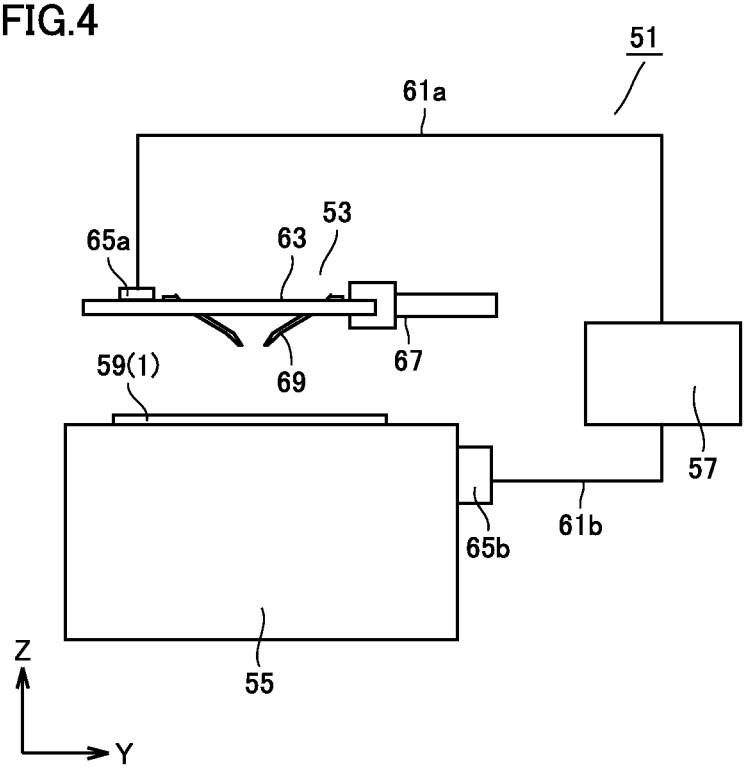
FIG. 4 is a side view schematically illustrating the structure of a semiconductor evaluation device for performing an electrical evaluation for the semiconductor device according to an embodiment of the present invention.

As illustrated in FIG. 4, a semiconductor evaluation device 51 mainly includes a probe body 53, a chuck stage 55 and an evaluation unit 57. Specifically, probe body 53 includes a contact probe 69, an insulating base 63 and a connection member 65a.

In evaluating the electrical characteristics for a semiconductor device, semiconductor evaluation device 51 is electrically connected to the semiconductor device through a pair of electrodes. Of the pair of electrodes, one electrode is contact probe 69, and the other electrode is the surface of chuck stage 55. For example, in the case where the semiconductor device is an IGBT, contact probe 69 is brought into contact with the surface of an emitter electrode and the surface of a gate electrode, and the surface of chuck stage 55 is brought into contact with a collector electrode.

Figure 5:
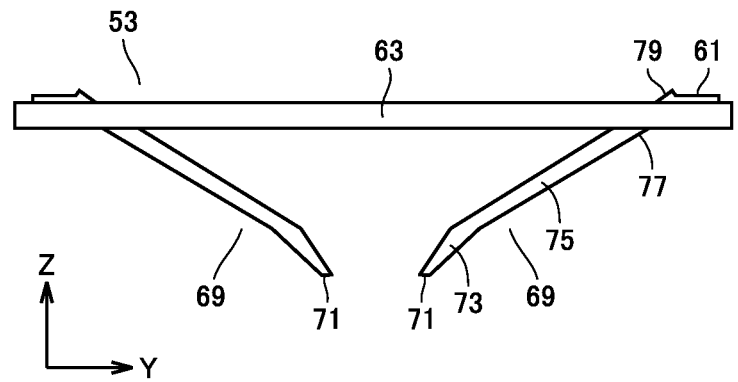
FIG. 5 is a side view schematically illustrating the structure of a probe body according to an embodiment of the present invention.

As illustrated in FIGS. 4 and 5, contact probe 69 is a cantilever-type contact probe. The cantilever-type contact probe 69 is formed with a tip end 73 which is machined into a needle shape. Tip end 73 is formed with a contact member 71 at a portion in contact with the surface electrode. It should be noted that although contact probe 69 is configured to have only tip end 73 inclined, it may have a multi-stage crank structure.

Contact probe 69 may be fabricated from metal material such as tungsten (W) or beryllium copper (BeCu) but not limited thereto. In particular, for the purpose of improving electrical conductivity and/or endurance, tip end 73 or contact member 71 of contact probe 69 may be coated with gold (Au), palladium (Pd), tantalum (Ta) or platinum (Pt), for example.

The body portion of contact probe 69 is formed with a flexible member 75, and thus, as contact member 71 contacts the surface electrode, flexible member 75 deflects. In FIG. 5, for the purpose of simplifying the drawing, contact probe 69 is only illustrated as a pair of contact probes 69 facing each other, and it should be noted that in practice even more contact probes may be provided.

Contact probe 69 is provided with a mounting member 77. Mounting member 77 is mechanically fixed to insulating base 63 which constitutes the base of probe body 53. Contact probe 69 is electrically connected to evaluation unit 57 via connection member 65a formed on insulating base 63 and via a signal lines 61a. The surface of chuck stage 55 is electrically connected to evaluation unit 57 via a connection member 65b provided on chuck stage 55 and via a signal line 61b.

Under an envisagement that a large current (5A or more, for example) will be applied to the semiconductor device, a plurality of contact probes 69 are supported on insulating base 63 in such a manner that each contact probe 69 is in contact with the semiconductor device. Moreover, in order to ensure that the density of current flowing through each contact probe 69 is approximately the same, connection member 65a and connection 65b are disposed in such a manner that the distance from connection member 65a to connection member 65b via contact probe 69, semiconductor device 1 and chuck stage 55 is approximately the same in each contact probe.

In the present embodiment, when observing insulating base 63 (or chuck stage 55) from the top in planar view, connection member 65a and connection member 65b are arranged to face each other, sandwiching therebetween chuck stage 55 on which the semiconductor device is placed. Each contact probe 69 and connection member 65a are electrically connected via an electrical connection member 79 provided on insulating base 63 and via a signal line 61.

Probe body 53 may be moved to an arbitrary position by a movable arm 67. It should be noted that in the present embodiment, although probe body 53 is illustrated as being supported by a single movable arm 67 but not limited thereto, probe body 53 may be supported by a plurality of mobile arms for better stability. Instead of moving probe body 53, it is possible to move chuck stage 55 alternatively.

Chuck stage 55 serves as a base for mounting semiconductor device 1 or a semiconductor wafer 59 and fixing the same thereon. Semiconductor device 1 or the like is fixed on chuck stage 55 by vacuum suction. The surface of chuck stage 55 is formed with a suction groove (not shown), and a part of the bottom surface of the suction groove is formed with suction holes. The main part of semiconductor evaluation device 51 is configured as described above.

Figure 6:
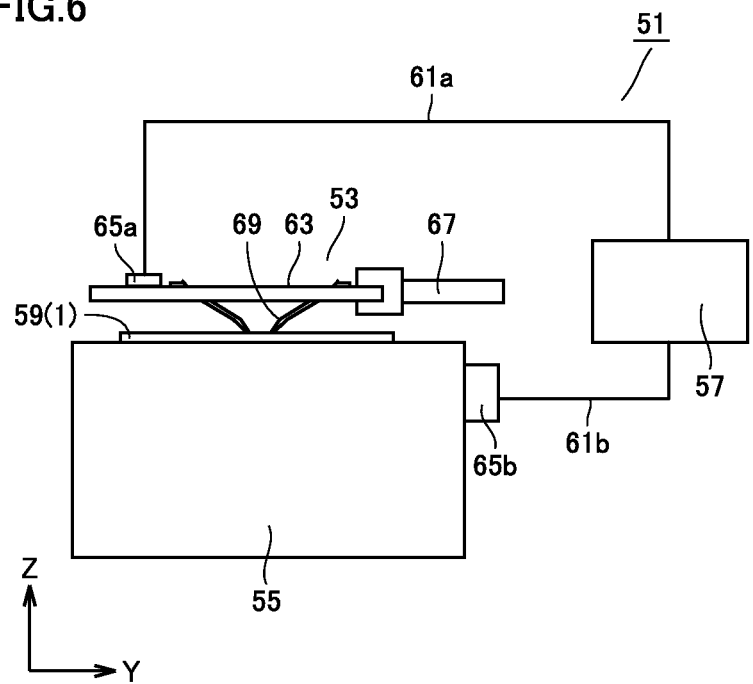
FIG. 6 is a side view illustrating a state in which a contact probe in the semiconductor evaluation device is brought into contact with the semiconductor device according to an embodiment of the present invention.

Hereinafter, the procedure of evaluating the electrical characteristics for a semiconductor device using semiconductor evaluation device 51 will be described. First, semiconductor device 1 or semiconductor wafer 59 with semiconductor device 1 integrated therein is mounted on chuck stage 55 by using a transport mechanism (not shown). Next, semiconductor device 1 or the like is fixed on chuck stage 55 by vacuum suction. Then, as illustrated in FIG. 6, movable arm 67 is moved so as to bring each of the plurality of contact probes 69 into contact with a corresponding surface electrode formed on semiconductor device 1 or the like. Then, the evaluation on the desired electrical characteristics is performed after the plurality of contact probes 69 are brought into contact with the corresponding surface electrodes.

Figure 7:
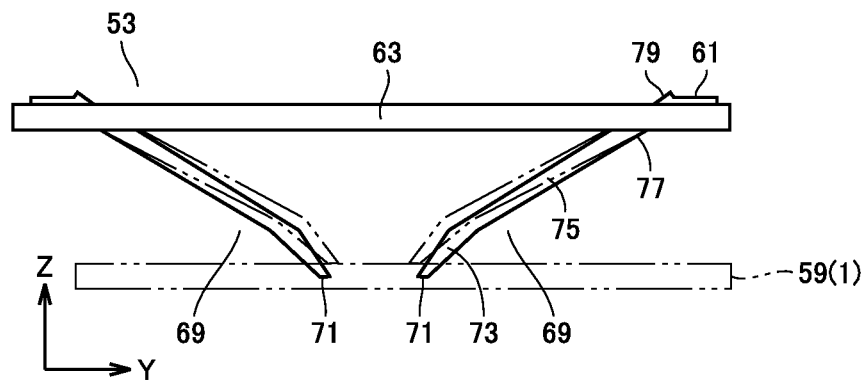
FIG. 7 is a enlarged side view partially illustrating the state in which the contact probe is in contact with the semiconductor device according to an embodiment of the present invention.

In the present embodiment, it is assumed that a single contact probe 69 is brought into contact with probe-contacting region 13 of gate electrode 9 of the IGBT provided in the semiconductor device, and a plurality of contact probes 69 are brought into contact with emitter electrode 11. At this time, as illustrated in FIG. 7, due to the deflection of contact probe, a probe trail is formed on the surface of the surface electrode. The probe trail will be described later.

In probe body 53, a plurality of contact probes 69 are arranged in such a manner that they are oriented from one end and the other end, respectively, toward the center of probe body 53, which makes it possible to bring the plurality of contact probes 69 into contact with the surface electrode while maintaining the spacing between the opposing contact probes 69. Maintaining the spacing between contact probes 69 is for the purpose of suppressing discharge.

After the electrical evaluation is completed, contact probes 69 are released from the surface electrode. In the case of semiconductor wafer 59, after the electrical evaluation is performed for all of semiconductor devices 1 integrated in semiconductor wafer 59, semiconductor wafer 59 is moved away from chuck stage 55, and another semiconductor device or another semiconductor wafer is mounted on the chuck stage for the evaluation of the electrical characteristics according to the same procedure.

Figure 8:
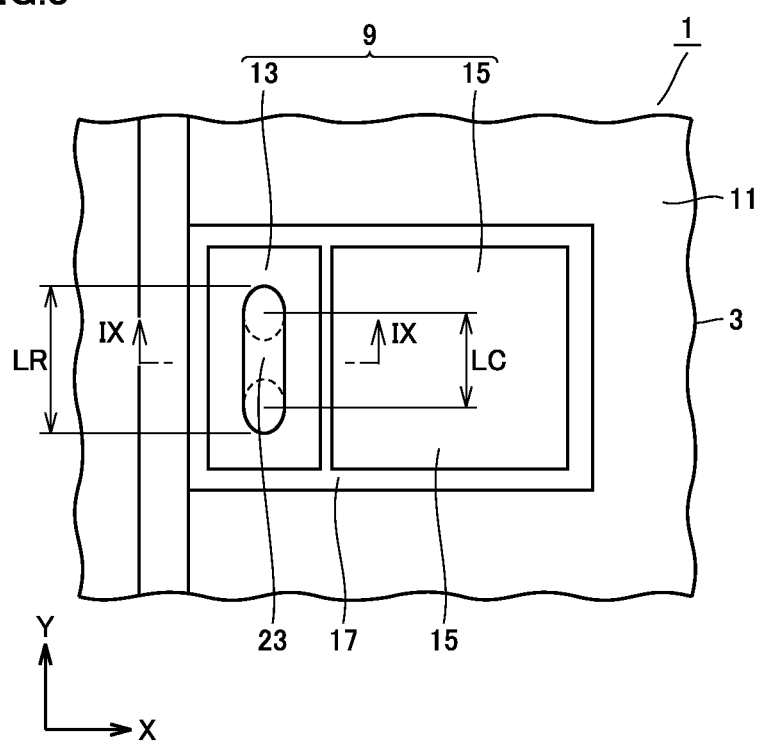
FIG. 8 is a enlarged planar view partially illustrating a gate electrode and a surrounding part thereof after the evaluation of electrical characteristics according to an embodiment of the present invention.

In performing the evaluation of the electrical characteristics by using the abovementioned contact probe, the contact probe (single contact probe) contacts probe-contacting region 13 of gate electrode 9 of semiconductor device 1, and thereby, after the evaluation of the electrical characteristics, as illustrated in FIG. 8, a probe trail 23 is left on probe-contacting region 13 of gate electrode 9.

In the cantilever-type contact probe 69, in order to bring tip end 73 of contact probe 69 into reliable contact with gate electrode 9 (surface electrode), as illustrated in FIG. 7, probe body 53 is made to approach semiconductor device 1 (semiconductor wafer 59) so that flexible member 75 of contact probe 69 is deflected. When contact probe 69 is being deflected, contact member 71 at tip end 73 slides on the surface of probe-contacting region 13, leaving probe trail 23 on the surface of probe-contacting region 13. The size of probe trail 23 is dependent on the displacing amount of contact member 71 and the size of contact member 71 itself. In the present embodiment, probe trail 23 has a length LR, and the distance between the centers of contact members 71 is equal to a length LC.

Figure 9:
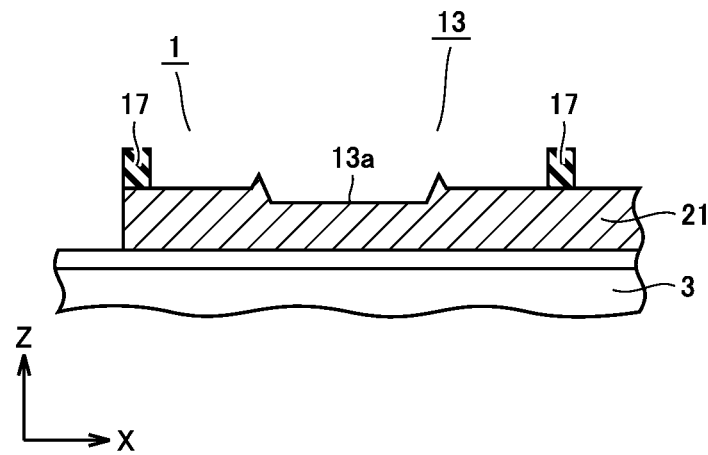
FIG. 9 is a enlarged cross-sectional view partially illustrating a part taken along a section line IX-IX illustrated in FIG. 8 according to an embodiment of the present invention.

From the consideration of endurance, it is common that the material selected for contact probe 69 is harder than the material selected for the surface electrode (gate electrode or the like). Therefore, as illustrated in FIG. 9, recesses 13a are formed in the region where contact member 71 slides in comparison with the surrounding region, becoming irregularities in probe-contacting region 13. In semiconductor device 1 according to the present embodiment, in order to prevent a wire from being connected to probe-contacting region 13 formed with irregularities, probe-contacting region 13 is separated from wiring region 15 to be wired.

Since wiring regions 15 is separated from probe-contacting region 13, it is possible to reliably and closely connect a wire to the surface of a plain and no probe trail region (wiring region 15) of gate electrode 9. As a result, even after the semiconductor device is assembled as a semiconductor module, the wire can be prevented from getting disconnected, and thus preventing the power supply from being interrupted reliably.

Figure 10:
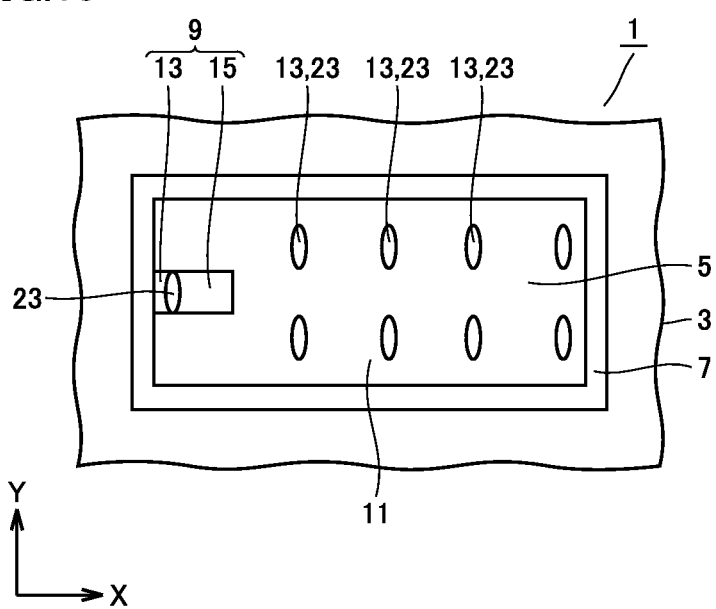
FIG. 10 is a planar view partially illustrating an emitter electrode and a surrounding part thereof after the evaluation of electrical characteristics according to an embodiment of the present invention.

In the present embodiment, probe-contacting region 13 is described as being defined in gate electrode 9, it is also possible to define the probe-contacting region in an emitter electrode. As illustrated in FIG. 10, probe-contacting regions 13 may be disposed in emitter electrode 11 with intervals along X direction and with intervals along Y direction. By disposing wiring regions in an area other than probe-contacting region 13, it is possible to prevent the wires from getting disconnected, and thereby preventing the power supply from being interrupted reliably. Accordingly, after the evaluation of the electrical characteristics for semiconductor device 1 is completed, the same number of probe trails as the number of the contact probes will be left on probe-contacting region 13.

The aforementioned semiconductor device is described in the case where gate electrode 9 is arranged at a center position of one side (short side) of element forming region 5 and adjacent to termination region 7. Hereinafter, modifications on the arrangement of the gate electrode in the element forming region will be described.

(First Modification)

As illustrated in FIG. 11, semiconductor device 1 according to the first modification is configured the same as semiconductor device 1 illustrated in FIG. 1 and the like except that gate electrode 9 is disposed at a corner of element forming region 5 adjacent to termination region 7, and thus, the same members will be denoted by the same reference numerals, and the description thereof will not be repeated unless necessary.

In the semiconductor device described above, in addition to the effect obtained through the separation of probe-contacting region 13 and wiring region 15, it is possible to obtain the following effects.

In semiconductor device 1 according to the first modification, gate electrode 9 is disposed at a corner of element forming region 5, and thereby, two of the four sides of the rectangular shaped gate electrode 9 adjoin to the boundary between gate electrode 9 and element forming region 5 in which emitter electrode 11 is provided. Thereby, as compared with the case where semiconductor device 1 illustrated in FIG. 1 and the like is configured to have three sides of the four sides of the rectangular gate electrode 9 adjoining the boundary, it is possible to ensure a wider area for element forming regions 5 in the same region (area) of semiconductor substrate 3.

(Second Modification)

As illustrated in FIG. 12, semiconductor device 1 according to the second modification is configured the same as semiconductor device 1 illustrated in FIG. 1 and the like except that gate electrode 9 is disposed in the center of element forming region 5 spaced with a distance from termination region 7, and thus, the same members will be denoted by the same reference numerals, and the description thereof will not be repeated unless necessary.

In the semiconductor device described above, in addition to the effect obtained through the separation of probe-contacting region 13 and wiring region 15, it is possible to obtain the following effects.

In semiconductor device 1 according to the second modification, gate electrode 9 is disposed centrally in element forming region 5. Thereby, when the gate electrode in the element forming region is turned on, a region where a channel is turned on will spread substantially uniformly from the center of element forming region 5 toward the periphery thereof, which makes it possible to further stabilize the electrical characteristics of semiconductor elements. Moreover, adopting such configuration can prevent the load from being concentrated on edges of element forming region 5 when connecting the wires.

As described above, probe-contacting region 13 and wiring region 15 are disposed in a surface electrode such as gate electrode 9 in the semiconductor device according to embodiments including the first modification and the second modification, and probe-contacting region 13 and wiring region 15 are separated by insulator 17. Thus, after semiconductor device 1 is assembled as a semiconductor module and subjected to the evaluation of electrical characteristics, it is possible to prevent probe-contacting region 13 formed with irregularities from being wired, so that as illustrated in FIG. 13, a wire 33 can be securely connected to wiring region 15. As a result, it is possible to prevent the wire from getting disconnected, and thereby preventing the power supply from being interrupted in semiconductor module 31.

It should be noted that in the semiconductor device described above, IGBT is given as an example of a semiconductor element formed in element forming region 5. The semiconductor element is not limited to IGBT, it may be any high withstand voltage semiconductor element used in power conversion or the like, for example, it may be a MOSFET (Metal Oxide Semiconductor Field Effect Transistor) or a diode. Also, the structure of the semiconductor device described in the embodiment may be combined in various manner if necessary.

The present invention can be effectively applied to a semiconductor device provided with a high withstand voltage semiconductor element and a semiconductor module provided with the semiconductor device.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
   a semiconductor substrate having a first main surface and a second main surfaces facing each other;

an element forming region defined on said first main surface of said semiconductor substrate;
a termination region defined on said first main surface of said semiconductor substrate and configured to surround said element forming region; and
a first main surface electrode formed in said element forming region,
said first main surface electrode having a first electrode and a second electrode, said first electrode provided with a first region and a second region,
said first region and said second region being separated by a separation member formed on a surface of said first electrode,
said first region being formed into a rectangular shape having a long side and a short side, and
said second region being located closer to said long side of said first region.

2. The semiconductor device according to claim 1, wherein
the area of said second region is set greater than the area of said first region.

3. The semiconductor device according to claim 1, wherein
a surface of said second region is formed with a reference mark.

4. The semiconductor device according claim 1, wherein
said first main surface electrode includes a gate electrode formed as said first electrode.

5. The semiconductor device according to claim 4, wherein
said gate electrode is disposed in the center of said element forming region spaced with a distance from said termination region.

6. The semiconductor device according to claim 4, wherein
said gate electrode is disposed in said element forming region at a corner adjacent to said termination region.

7. The semiconductor device according to claim 4, wherein
said gate electrode is disposed in said element forming region at a position adjacent to said termination region.

8. The semiconductor device according to claim 4, wherein
said gate electrode is formed as said first electrode,
said first region is disposed closer to said termination region, and
said second region is disposed opposite to said termination region with said first region sandwiched therebetween.

9. The semiconductor device according to claim 1, wherein
said first main surface electrode includes an emitter electrode formed as said second electrode,
said emitter electrode is provided with a plurality of third regions, and
a plurality of said third regions are disposed in a first direction with an interval along said first direction and with an interval along a second direction intersecting said first direction.

10. The semiconductor device according to claim 1, wherein
said semiconductor device is provided with a second main surface electrode formed on a surface of said second main surface of said semiconductor substrate.

11. A semiconductor module provided with the semiconductor device according to claim 1, wherein
a wire is connected to said second region of said first electrode.

* * * * *